(12) United States Patent
Daigle et al.

(10) Patent No.: US 10,845,426 B2
(45) Date of Patent: Nov. 24, 2020

(54) ELECTRIC GROUND FAULT DETECTION SYSTEM AND METHOD

(71) Applicant: General Electric Company, Schenectady, NY (US)

(72) Inventors: Jeffrey Louis Daigle, Erie, PA (US); Jeffrey John Wolff, Erie, PA (US); Latha Belagumba Narasegowda, Bangalore (IN); Swapan Kumar Kundu, Bangalore (IN)

(73) Assignee: GE GLOBAL SOURCING LLC, Norwalk, CT (US)

( * ) Notice: Subject to any disclaimer, the term of this patent is extended or adjusted under 35 U.S.C. 154(b) by 219 days.

(21) Appl. No.: 16/164,204

(22) Filed: Oct. 18, 2018

(65) Prior Publication Data
US 2019/0049507 A1 Feb. 14, 2019

Related U.S. Application Data

(63) Continuation of application No. 15/232,969, filed on Aug. 10, 2016, now Pat. No. 10,132,850.

(51) Int. Cl.
| | |
|---|---|
| *G01R 31/50* | (2020.01) |
| *H02H 7/122* | (2006.01) |
| *G01R 31/00* | (2006.01) |
| *B60L 50/51* | (2019.01) |
| *H02P 27/06* | (2006.01) |
| *H02H 3/16* | (2006.01) |
| *G01R 31/34* | (2020.01) |

(52) U.S. Cl.
CPC .............. *G01R 31/50* (2020.01); *B60L 50/51* (2019.02); *G01R 31/007* (2013.01); *G01R 31/008* (2013.01); *H02H 7/1225* (2013.01); *G01R 31/343* (2013.01); *H02H 3/162* (2013.01); *H02H 3/165* (2013.01); *H02P 27/06* (2013.01)

(58) Field of Classification Search
USPC ...................................................... 361/42–50
See application file for complete search history.

(56) References Cited

U.S. PATENT DOCUMENTS

| | | | |
|---|---|---|---|
| 5,992,950 A * | 11/1999 | Kumar ...................... | B60L 7/22 303/151 |
| 2009/0147415 A1 * | 6/2009 | Lazarovich .............. | H02H 9/08 361/42 |

* cited by examiner

*Primary Examiner* — Danny Nguyen
(74) *Attorney, Agent, or Firm* — Christopher R. Carroll; The Small Patent Law Group, LLC (57) ABSTRACT

A system for testing a ground fault detection system in an electric circuit establishes a ground connection between a bus and the ground via an inverter and a load by closing an inverter switch of the inverter and a grounding switch disposed between the load and the ground, determines whether the ground connection is detected, and determines a fault in the ground fault detection system responsive to the first ground connection not being detected by the ground fault detection system. Optionally, a ground fault may be identified by determining three phase voltages provided from each of plural inverters, determining symmetrical components of the three phase voltages for each of the inverters, and identifying a ground fault in one or more of the inverters while powered by the power supply based on the symmetrical components.

20 Claims, 8 Drawing Sheets

ELECTRIC GROUND FAULT DETECTION SYSTEM AND METHOD

CROSS-REFERENCE TO RELATED APPLICATIONS

This application is a continuation of U.S. patent application Ser. No. 15/232,969, which was filed on 10 Aug. 2016, and the entire disclosure of which is incorporated herein by reference.

FIELD

Embodiments of the subject matter described herein relate to systems and methods that detect electrical grounds in electric circuits, such as electric circuits of vehicles.

BACKGROUND

A ground fault is a significant contributor of electrical faults experienced in many types of electrical equipment. In some operating conditions, such as vehicles operating in damp, wet, and dusty environments, the frequency of ground faults may be increased relative to systems that operate in other conditions. While various regulations mandate inclusion of ground fault detecting devices in electrical systems, failure to test the functionalities of these detecting devices can pose significant safety risks, and result in severe component damage due to arcing and/or fire caused by the ground faults that are not detected in time. Additionally, extended downtime of the electrical equipment can have significant cost impacts on the equipment.

In some vehicles (e.g., rail vehicles such as locomotives), a ground fault typically occurs at inverter load motors and cables. This type of fault may be the result of a loss of insulation. Currently, the ground fault is detected by individually shutting down each of several inverters onboard the vehicle, determining if the ground fault is still present, and eliminating various inverters as the source or cause of the ground fault until the ground fault is not detected when the responsible inverter is shut down. This process typically requires the vehicle to be shut down and stationary, thereby preventing continued use of the vehicle.

In mining vehicles, a ground fault detection circuit trip test can be carried out manually to test whether a ground fault in circuits of the vehicles is detected by ground fault detection hardware of the vehicles. The test may be performed using jumper wire on a 1,000-volt direct current (DC) bus by an elaborate manual sequence of charging and discharging the circuit. The failure to follow the test procedure may cause injury to persons or components.

BRIEF DESCRIPTION

In one embodiment, a method (e.g., for identifying ground faults in one or more inverters of a circuit of a powered system) includes determining three phase voltages provided from each of plural inverters in a powered system to one or more loads of the powered system while each of the inverters is powered by a power supply, determining symmetrical components of the three phase voltages for each of the inverters, and identifying a ground fault in one or more of the inverters while each of the inverters is powered by the power supply based on the symmetrical components of the three phase voltages.

In one embodiment, a method (e.g., for testing a ground fault detection system in an electric circuit) includes establishing a first ground connection between a bus (in a powered circuit comprising an inverter coupled with a power supply via the bus and that supplies current to a load of the powered circuit) and a ground via the inverter and the load by closing an inverter switch of the inverter and a grounding switch disposed between the load and the ground, determining whether the first ground connection is detected by a ground fault detection system conductively coupled with the inverter, the power supply, the load, and the ground, and determining a fault in the ground fault detection system responsive to the first ground connection not being detected by the ground fault detection system.

In one embodiment, a system includes an inverter conductively coupled with a load by inverter switches in the inverter. The inverter is configured to convert a direct current to an alternating current supplied to the load. The system also includes a bus conductively coupled with a power supply and the inverter. The bus is configured to conduct the direct current from the power supply to the inverter. The system includes a grounding switch conductively coupled with the load and a ground between the load and the ground. The grounding switch is configured to close to couple the load with the ground and a first inverter switch in the inverter is configured to close to establish a first ground connection between the bus and the ground via the load. The system includes a ground fault detection system conductively coupled with the bus and the ground. The ground fault detection system is configured to detect conduction of current to the ground as a ground fault. The system includes one or more processors configured to determine a fault in the ground fault detection circuit responsive to the first ground connection not being detected by the ground fault detection system.

BRIEF DESCRIPTION OF THE DRAWINGS

The subject matter described herein will be better understood from reading the following description of non-limiting embodiments, with reference to the attached drawings, wherein below.

DETAILED DESCRIPTION

One or more embodiments of the inventive subject matter described herein relate to ground fault detection systems and methods that detect ground faults within circuits. The ground faults may be detected within one or more electric devices, such as inverters. While the description herein focuses on detecting ground faults in circuits that supply power to one or more inverters and motors of a vehicle, not all embodiments of the inventive subject matter are limited to vehicles, and one or more embodiments may apply to circuits in non-vehicular systems.

Figure 1:
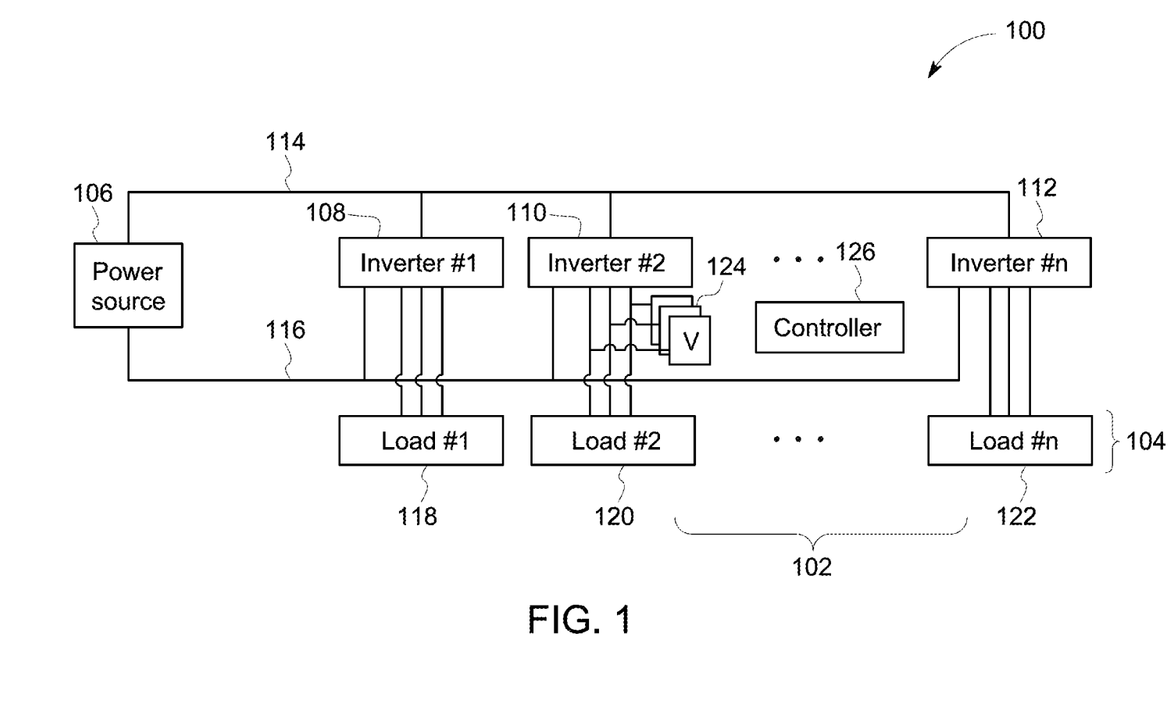
FIG. 1 illustrates a power supply circuit having a ground fault detection system according to one embodiment.

FIG. 1 illustrates a power supply circuit 100 having a ground fault detection circuit or system 102 according to one embodiment. The power supply circuit 100 may supply electric current to a powered system 104, such as a propulsion system of a vehicle or another type of system. The circuit 100 includes a power source 106 that supplies electric current to one or more inverters 108, 110, 112 ("Inverter #1," "Inverter #2," and "Inverter # n" in FIG. 1) via conductive buses 114, 116. The bus 114 may be referred to as a DC positive bus as the bus 114 conducts positive DC current and the bus 116 may be referred to as a DC negative bus as the bus 116 conducts the negative portion of the DC current. The power source 106 may represent an alternator, a generator, battery, capacitor, or other device that supplies DC to the inverters 108, 110, 112. The number of inverters 108, 110, 112 shown in FIG. 1 is provided as one example, and is not limiting on all embodiments of the subject matter disclosed herein.

The inverters 108, 110, 112 receive DC from the power source 106 and convert the DC into alternating current (AC) that is provided to one or more loads 118, 120, 122 ("Load #1," "Load #2," and "Load # n" in FIG. 1) of the powered system 104 for powering the loads 118, 120, 122. While three loads 118, 120, 122 are shown in FIG. 1, the powered system 104 may include a single load, two loads, or more than three loads. The loads 118, 120, 122 can represent traction motors of a vehicle. Optionally, one or more of the loads 118, 120, 122 may represent another type of load, such as a motor driving auxiliary loads of a propulsion system (e.g., loads that do not propel a vehicle).

In the illustrated example, the inverters 108, 110, 112 each supply different phases of a three-phase AC supplied to different ones of the loads 118, 120, 122. For example, each of the inverters 108, 110, 112 may supply a first phase (e.g., phase A) of AC, a second phase (e.g., phase B) of AC that is temporally shifted or delayed relative to the first phase (e.g., by one hundred and twenty degrees), and a third phase (e.g., phase C) of AC that is temporally shifted or delayed relative to the second phase (e.g., by one hundred and twenty degrees) to a corresponding load 118, 120, 122.

The ground fault detection system 102 includes one or more sensors 124 and a controller 126. The controller 126 represents hardware circuitry that includes and/or is connected with one or more processors (e.g., controllers, microprocessors, field programmable gate arrays, integrated circuits, etc.). The sensor(s) 124 measure electrical characteristics of the current conducted through the circuit 100, such as voltage. The controller 126 examines these characteristics to identify and/or predict a ground fault of one or more of the inverters 108, 110, 112, as described herein.

In one embodiment, the detection system 102 examines the voltages of the different phases of AC supplied to the loads 118, 120, 122. For example, each inverter may be conductively coupled with a different load by three (or more) conductive buses. A different sensor 124 may be coupled with each of these buses in order to separately measure the voltage conducted on each bus. Each bus may be used to conduct a different phase of the three phase voltages supplied from each inverter to the corresponding load. While only one set of sensors 124 is shown in FIG. 1, the system 102 may include more sensors 124. The sensors 124 may be communicatively coupled with the controller 126, such as by one or more wired and/or wireless connections.

Figure 2:
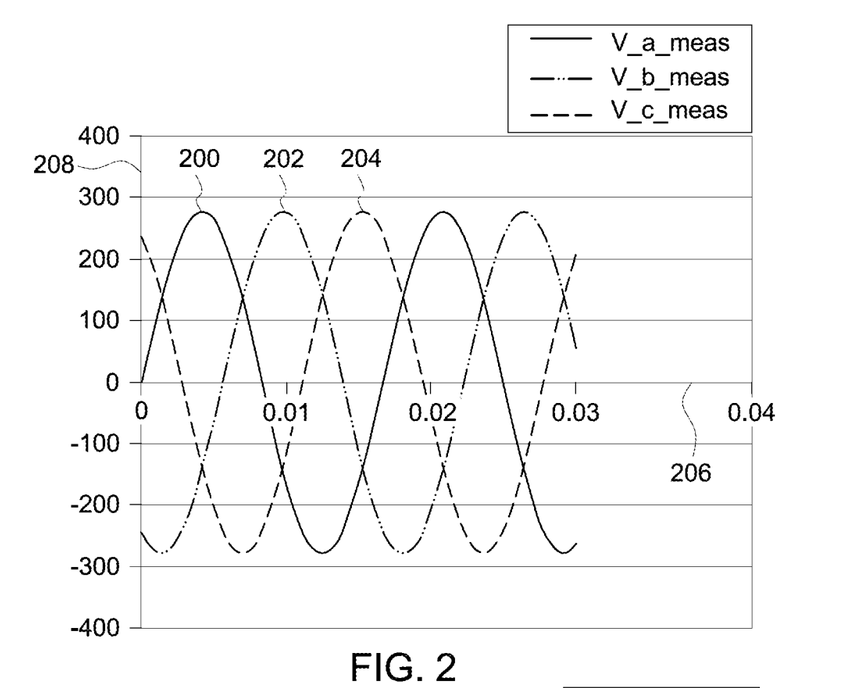
FIG. 2 illustrates three voltages supplied to a load by a corresponding inverter shown in FIG. 1 according to one example where no ground fault condition exists.

FIG. 2 illustrates three voltages 200, 202, 204 supplied to one of the loads 118, 120, 122 by a corresponding inverter 108, 110, 112 shown in FIG. 1 according to one example where no ground fault condition exists. The voltages 200, 202, 204 ("V_a_meas," "V_b_meas," and "V_c_meas" in FIG. 2) are shown alongside a horizontal axis 206 representative of time and a vertical axis 208 representative of voltage. Each of the voltages 200, 202, 204 represents a different phase of the AC supplied to the load by an inverter. For example, the voltage 200 can represent the first phase or phase A of the AC conducted to the load by the inverter, the voltage 202 can represent the second phase or phase B of the AC conducted to the load by the inverter, and the voltage 204 can represent the third phase or phase C of the AC conducted to the load by the inverter. The voltages 200, 202, 204 may be measured by the sensor(s) 124 in the detection system 102 shown in FIG. 1. The voltages 200, 202, 204 are measured with respect to a ground of the powered circuit 100, such as a chassis ground of a vehicle.

Figure 3:
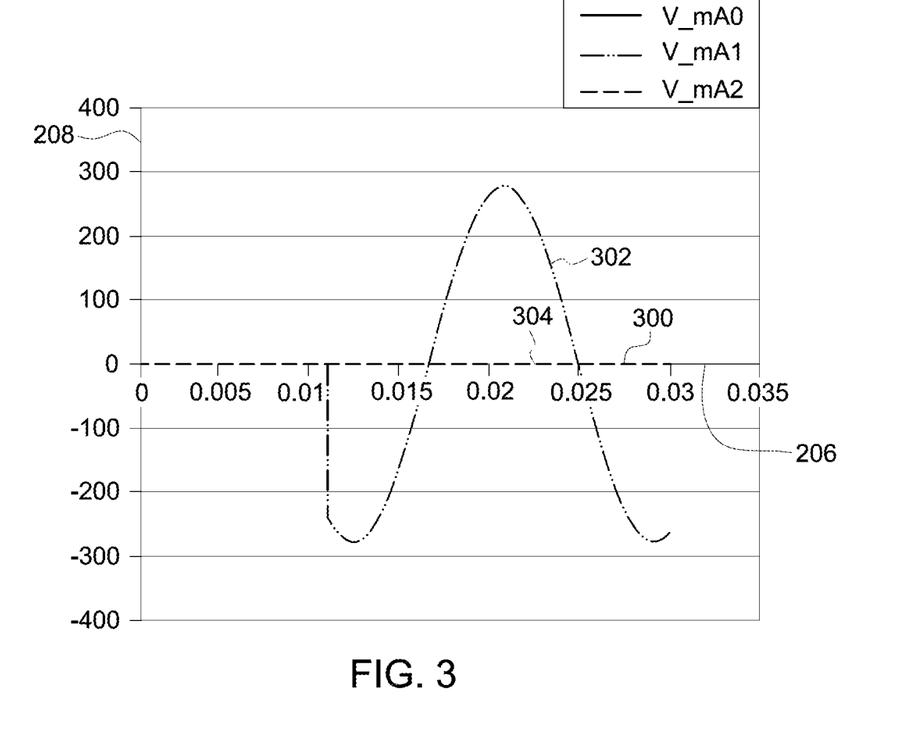
FIG. 3 illustrates symmetric component representations of the voltages shown in FIG. 2 according to one example.

FIG. 3 illustrates symmetric component representations 300, 302, 304 of the voltages 200, 202, 204 shown in FIG. 2 according to one example. The symmetric component representations 300, 302, 304 ("V_mA0," "V_mA1," and "V_mA2" in FIG. 3) are shown alongside the horizontal and vertical axes 206, 208. The symmetric component representations 300, 302, 304 may be determined by the controller 126 of the detection system 102 shown in FIG. 1 based on the voltages 200, 202, 204. The voltages 200, 202, 204 and symmetric component representations 300, 302, 304 are obtained during a balanced condition of the circuit 100 where no ground faults exist on the buses 114, 116 shown in FIG. 1.

Figure 4:
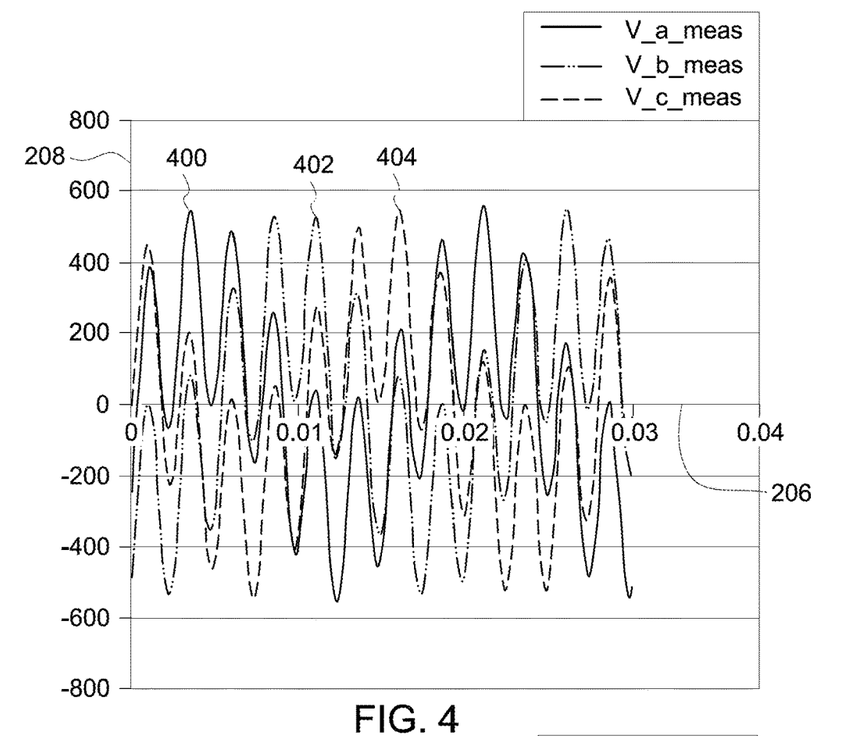
FIG. 4 illustrates three voltages supplied to a load by an inverter shown in FIG. 1 according to one example where a ground fault condition exists.

FIG. 4 illustrates three voltages 400, 402, 404 supplied to a load by an inverter shown in FIG. 1 according to one example where a ground fault condition exists. The voltages 400, 402, 404 ("V_a_meas," "V_b_meas," and "V_c_meas" in FIG. 2) are shown alongside the horizontal and vertical axes 206, 208. Each of the voltages 400, 402, 404 represents a different phase of the AC supplied to the load by an inverter, as described above in connection with the voltages 200, 202, 204. The voltages 400, 402, 404 may be measured by the sensor 124 in the detection system 102 shown in FIG. 1. The voltages 400, 402, 404 are measured with respect to the ground of the circuit 100, such as a chassis ground.

Figure 5:
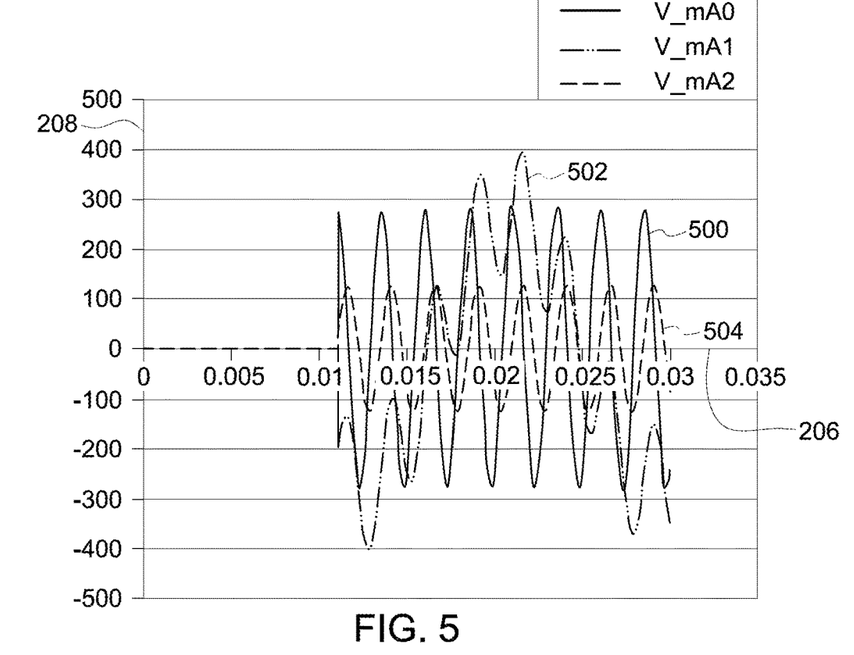
FIG. 5 illustrates symmetric component representations of the voltages shown in FIG. 4 according to one example.

FIG. 5 illustrates symmetric component representations 500, 502, 504 of the voltages 400, 402, 404 shown in FIG. 4 according to one example. The symmetric component representations 500, 502, 504 ("V_mA0," "V_mA1," and "V_mA2" in FIG. 5) are shown alongside the horizontal and vertical axes 206, 208. The symmetric component representations 500, 502, 504 may be determined by the controller 126 of the detection system 102 shown in FIG. 1 based on the voltages 400, 402, 404. The voltages 400, 402, 404 and symmetric component representations 500, 502, 504 are obtained during a ground fault condition of the circuit 100 where a ground fault exists on the buses 114, 116 shown in FIG. 1. For example, the voltages 400, 402, 404 and symmetric component representations 500, 502, 504 may be measured in the presence of an AC ground of a current having a frequency that differs from the excitation frequency of the load (e.g., the frequency of the current powering the load). In the illustrated example, the excitation frequency of the load is 60 hertz and the frequency of the AC ground is 400 hertz.

The controller 126 of the detection system 102 can examine the symmetric component representations 500, 502, 504 to determine a source of the ground fault (e.g., which inverter is connected with the ground), and optionally can determine the severity (e.g., magnitude) of the ground fault and/or one or more responsive actions to implement in response to the identified source and/or severity. The controller 126 of the detection system 102 can examine the zero sequence component of the symmetric component representations 500, 502, 504 to determine the magnitude and frequency of the current of the ground fault. The excitation frequency of the load may be communicated or otherwise known to the controller 126 of the detection system 102 from a vehicle controller that controls the excitation frequency. The controller 126 of the detection system 102 can compare the frequencies of the symmetric component representations 500, 502, 504 to the known excitation frequency to determine which of the symmetric component representations 500, 502, 504 have a frequency that differs from the excitation frequency.

In the illustrated example, the symmetric component representation 500 has a zero sequence component (e.g., the constant voltage added to the AC, the average of the AC, the vertical offset of the AC, etc.) that is larger than the zero sequence components of the other symmetric component representations 502, 504. While the symmetric component representation 502 has larger positive and negative peaks than the symmetric component representations 500, 504, the zero sequence component of the symmetric component representation 502 is smaller than that of the symmetric component representations 500, 504, as demonstrated by the smaller peak-to-peak variances in the symmetric component representation 502 compared to the symmetric component representations 500, 504.

This larger zero sequence component indicates that the inverter is experiencing a ground fault. In one embodiment, the size of the zero sequence component (e.g., the height of the peaks in the ground current) can indicate the severity of the ground fault, with larger positive peak-to-negative peak differences indicating more severe ground faults. Optionally, the forward sequence and/or reverse sequence voltages of the symmetric component representations 500, 502, 504 can also be examined in order to identify the ground fault. The forward sequence voltages of the symmetric component representations 500, 502, 504 are the voltages of a set of phasors representing the phases of AC provided by the inverter to the load and having the same phase sequence as the phases of AC provided by the inverter to the load (e.g., the phasor for phase A followed by the phasor for phase B followed by the phasor for phase C).

The reverse sequence voltages of the symmetric component representations 500, 502, 504 are the voltages of a different set of phasors representing the phases of AC provided by the inverter to the load and having the reverse phase sequence as the phases of AC provided by the inverter to the load (e.g., the phasor for phase C followed by the phasor for phase B followed by the phasor for phase A). If the forward and/or reverse sequence voltages of a symmetric component representation 500, 502, or 504 are larger than other symmetric component representations 500, 502, or 504, then the symmetric component representation 500, 502, or 504 having the larger forward and/or reverse sequence voltages may be identified as indicative of a ground fault.

In order to identify which inverter is grounded or the source of the ground fault, the processor(s) of the detection system 102 can examine the frequency of the voltage 400, 402, 404 and/or symmetric component representation 500, 502, 504 indicative of the ground fault (as described above) and the excitation frequency or frequencies of the loads 118, 120, 122. If the frequency of the fault-associated voltage 400, 402, 404 or symmetric component representation 500, 502, 504 differs from the excitation frequency of a load, then the inverter providing the voltage 400, 402, 404 or symmetric component representation 500, 502, 504 indicative of the ground fault and having the frequency that differs from the excitation frequency is identified as the source of the ground fault.

The detection system 102 may monitor the voltages conducted from the inverters for the loads connected to the same buses 114, 116 during movement of a vehicle. While other devices used to identify ground faults may operate by turning loads of the vehicle off, the detection system 102 can identify ground faults during movement of the vehicle and/or when the loads 118, 120, 122 are powered by the power source 106.

Optionally, the detection system 102 may check for ground faults based on voltage measurements provided by a voltage sensor connected with the positive DC bus 114 (e.g., between the power source 106 and the inverters 108, 110, 112). This sensor may measure the voltage conducted on the bus 114 relative to the ground or chassis ground. If the magnitude of the voltage conducted on this bus 114 changes to indicate a ground fault (e.g., the zero sequence component of the voltage decreases significantly, such as by at least 50% or more relative to the absence of a ground fault), then the detection system 102 can examine the frequency at which the voltage changes. If the frequency matches the frequency at which an inverter 108, 110, or 112 is driven, then the detection system 102 can determine that the inverter 108, 110, or 112 with the matching frequency is experiencing a ground fault.

Figure 6:
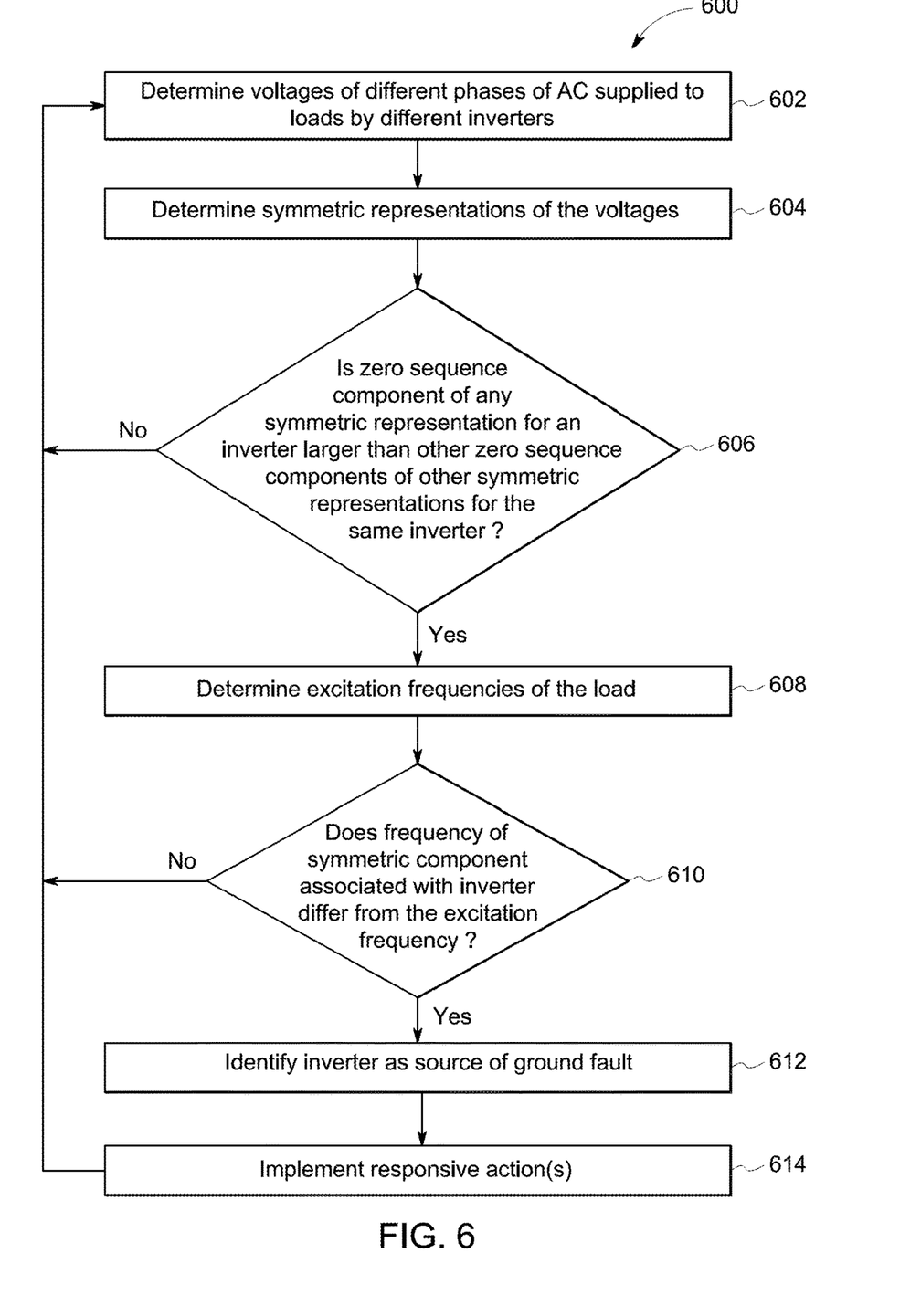
FIG. 6 illustrates a flowchart of one embodiment of a method for identifying ground faults in one or more inverters of a circuit of a powered system.

FIG. 6 illustrates a flowchart of one embodiment of a method 600 for identifying ground faults in one or more inverters of a circuit of a powered system. The method 600 may be used to identify ground faults in a circuit that supplies current to motors of a vehicle during movement of the vehicle (e.g., by the motors), or may be used to identify ground faults in other circuits. The flowchart of the method 600 represents operations performed by the controller 126 shown in FIG. 1, and/or can be used to create software that directs the operations of the controller 126 to identify ground faults.

At 602, voltages of different phases of AC supplied to one or more different loads by one or more corresponding inverters are determined. These voltages can be measured by sensors 124 that measure the voltages of the different phases of current supplied to the load(s). At 604, symmetric components of the measured voltages are determined. The symmetric components may be determined by the controller 126. At 606, the zero sequence component of the symmetric components is examined to determine if the zero sequence component is larger than other zero sequence components. For example, the zero sequence components of the symmetric components determined for the voltages measured from the same inverter are compared to determine if one of the zero sequence components is larger (e.g., has a larger peak or peak-to-peak variance).

If one of the zero sequence components for an inverter is larger than other zero sequence components for the same inverter, then the larger zero sequence component may indicate that the inverter is associated with or is the source of a ground fault. As a result, flow of the method 600 may proceed toward 608. But, if no zero sequence component for the inverter is larger than the other zero sequence components of the same inverter (e.g., by at least a threshold amount, such as 10%, 20%, or 30% larger than the other zero sequence components), then this may indicate that a ground fault is not present for the inverter. As a result, flow of the method 600 may return toward 602 to continue monitoring the inverters.

At 608, excitation frequencies of the loads being powered by the inverters are determined. These excitation frequencies can be determined based on the settings (e.g., throttle settings, power settings, etc.) of the loads. For example, different speeds, throttle positions, etc. of motors can be associated with different excitation frequencies of the current supplied to the motors. The excitation frequencies of the currents supplied to the loads can be determined based on these settings.

At 610, a determination is made as to whether the frequency of the symmetric component associated with the ground fault matches the excitation frequency of the load driven by an inverter. If the frequency of the symmetric component differs from the excitation frequency of a load, then the inverter associated with the symmetric component is identified as the source of the ground fault. As a result, flow of the method 600 can proceed toward 612. Otherwise, flow of the method 600 can return toward 602.

At 612, the inverter associated with the symmetric component having the frequency that differs from the excitation frequency of the load powered by the inverter is identified as the source of the ground fault. At 614, one or more responsive actions may be implemented. For example, the inverter identified as the source of the ground fault may be turned off or deactivated. The inverter may be decoupled from the power supply circuit by opening one or more switches that couple the inverter with the circuit. Optionally, an operator of the powered system (e.g., vehicle) may be notified of the ground fault by one or more alarms or messages communicated from the controller 126 to an output device, such as a display, speaker, light, etc.

Another embodiment of the inventive subject matter disclosed herein relates to checking or examining operation of a ground fault detection system of a powered system. A monitoring system may autonomously check for proper operation of a ground fault detection system without requiring manual intervention, interaction with, or manipulation of components of the powered system, such as a vehicle. This can allow for the monitoring system to check for and identify any faults with a ground fault detection system while avoiding harming any operators of the powered system.

Figure 7:
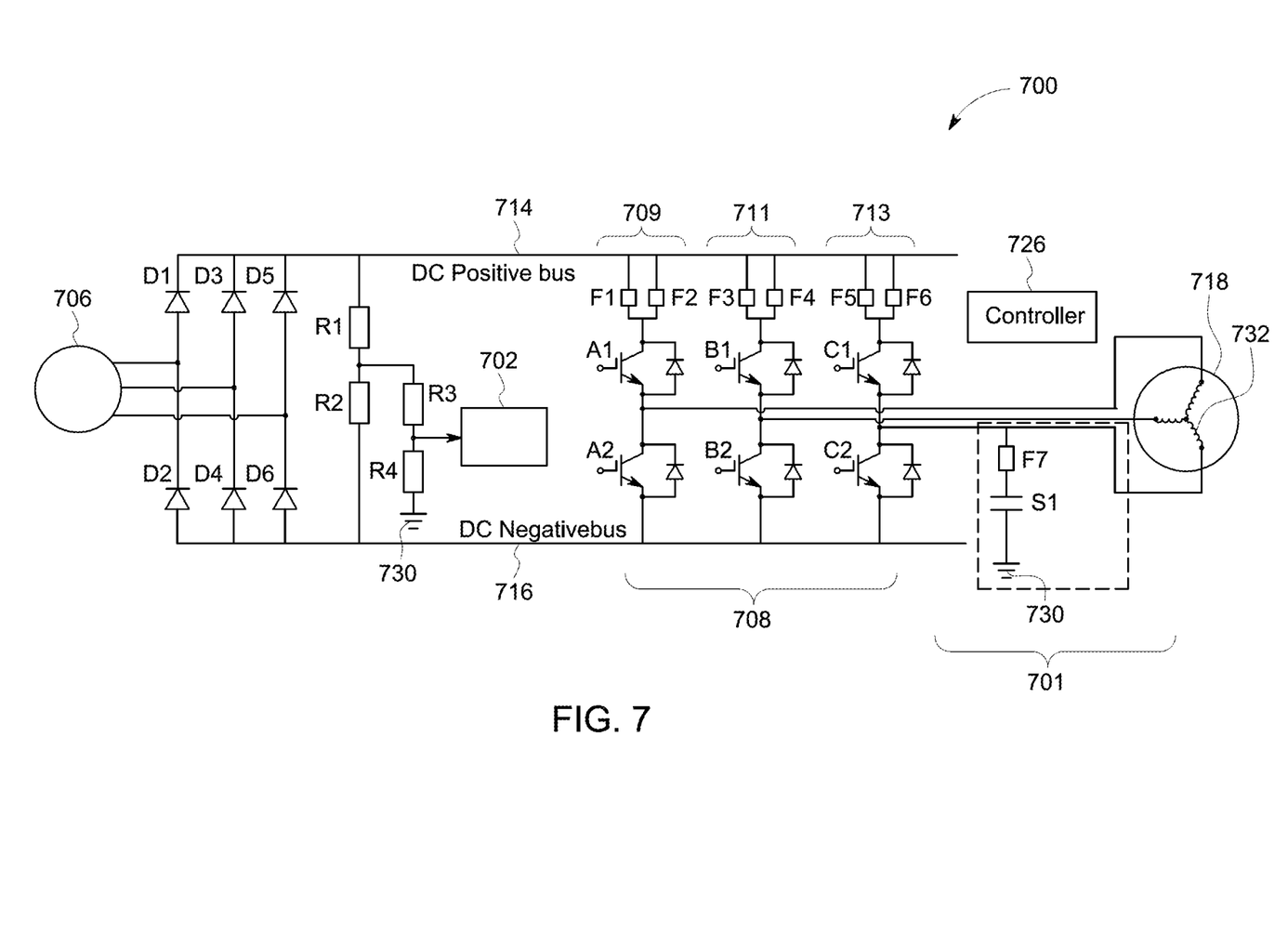
FIG. 7 illustrates a testing system for a ground fault detection system according to one embodiment.

FIG. 7 illustrates a testing system 701 according to one embodiment. The testing system 701 is operatively coupled with a power supply circuit 700, such as a circuit of a propulsion system of a vehicle. Alternatively, the testing system 701 may be coupled with another type of powered system. As described below, the testing system 701 examines operation of a ground fault detection system 702 ("Ground Fault Detection" in FIG. 7) to ensure that the detection system 702 is functioning properly and is able to detect one or more ground faults in the circuitry 700 of the powered system. The testing system 701 may examine operation of the detection system 702 by changing a state of the circuitry 700 of the powered system to create a ground or ground fault and determining whether the detection system 702 identified the ground or ground fault. In one embodiment, the detection system 702 represents the detection system 102 shown in FIG. 1. Alternatively, the detection system 702 represents other circuitry capable of identifying ground faults in the circuit 700.

The circuit 700 conductively couples a power source 706 ("Alternator" in FIG. 1) that supplies electric current one or more inverters 708 via conductive buses 714, 716 ("DC Positive Bus" and "DC Negative Bus" in FIG. 1). In one embodiment, the power source 706 represents the power source 106 shown in FIG. 1, the inverter 708 represents one or more of the inverters 108, 110, 112, shown in FIG. 1, the bus 714 represents the bus 114 shown in FIG. 1, and/or the bus 716 represents the bus 116 shown in FIG. 1. The power source 706 is illustrated as an alternator, but optionally may represent a generator, battery, capacitor, or other device that supplies current to the inverter 708. While only a single inverter 708 is shown in FIG. 7, the powered system may include a greater number of inverters 708.

The inverter 708 receives DC from the power source 706 and converts the DC into AC that is provided to one or more loads 718 ("Traction Motor" in FIG. 1) for powering the load 718. In one embodiment, the load 718 represents one or more of the loads 118, 120, 122 shown in FIG. 1. While only a single load 718 is shown in FIG. 7, the powered system may include two or more loads 718 coupled with the same buses 714, 716 via additional inverters 708. While the load 718 is labeled as a traction motor in FIG. 7, optionally, the load 718 and/or one or more additional loads 718 may represent another type of loads, such as a motor driving auxiliary loads of the powered system (e.g., loads that do not propel a vehicle).

In the illustrated example, the inverter 708 supplies different phases of a three-phase AC to the load 718. For example, the inverter 708 may supply a first phase (e.g., phase A) of AC to the load 718 via a first leg 709 of the inverter 708 having two switches A1, A2, a second phase (e.g., phase B) of AC that is temporally shifted or delayed relative to the first phase (e.g., by one hundred and twenty degrees) via a second leg 711 of the inverter 708 having two switches B1, B2, and a third phase (e.g., phase C) of AC that is temporally shifted or delayed relative to the second phase (e.g., by one hundred and twenty degrees) via a third leg 713 of the inverter 708 having two switches C1, C2.

The detection system 702 represents hardware circuitry that includes and/or is connected with one or more processors (e.g., controllers, microprocessors, field programmable gate arrays, integrated circuits, etc.). The detection system 702 includes one or more sensors that measure electrical characteristics of the current conducted through the circuitry 700 of the powered system. The processors of the detection system 702 examine these characteristics to identify and/or predict a ground fault of the inverter 708, as described above. In one embodiment, the detection system 702 may represent an auxiliary inverter of the powered system, such as an inverter that drives a load that does not propel a vehicle. This inverter may include or be coupled with one or more processors to identify ground faults, as described herein.

The testing system 701 includes a grounding switch S1 that is conductively coupled with a ground 730 (e.g., a chassis ground of a vehicle). The switch S1 may be disposed between the load 718 and the ground 730 so that the switch S1 can be controlled by the controller 726 to alternate between an open state (where the switch S1 disconnects the load 718 from the ground 730) and a closed state (where the switch S1 connects the load 718 with the ground 730). Optionally, a fuse F7 may be disposed between the switch S1 and the load 718. The fuse F7 can provide protection to the components of the powered system. For example, in the event of a shoot through (e.g., DC link short circuit), the fuse F7 opens and disconnects the ground 730 from the circuit 700 of the powered system. This opening of the fuse F7 protects the switch S1, and avoids any contingent damage to the components of the powered system that are connected with or included in the circuit 700.

As described herein, the testing system 701 can examine operation of the ground fault detection system 702 by closing the switch S1 and the inverter switch A1 or A2 to connect the circuit 700 to the ground 730 via the load 718. If the detection system 702 detects a ground or ground fault, then the testing system 701 can determine that the detection system 702 is operating properly.

Figure 8:
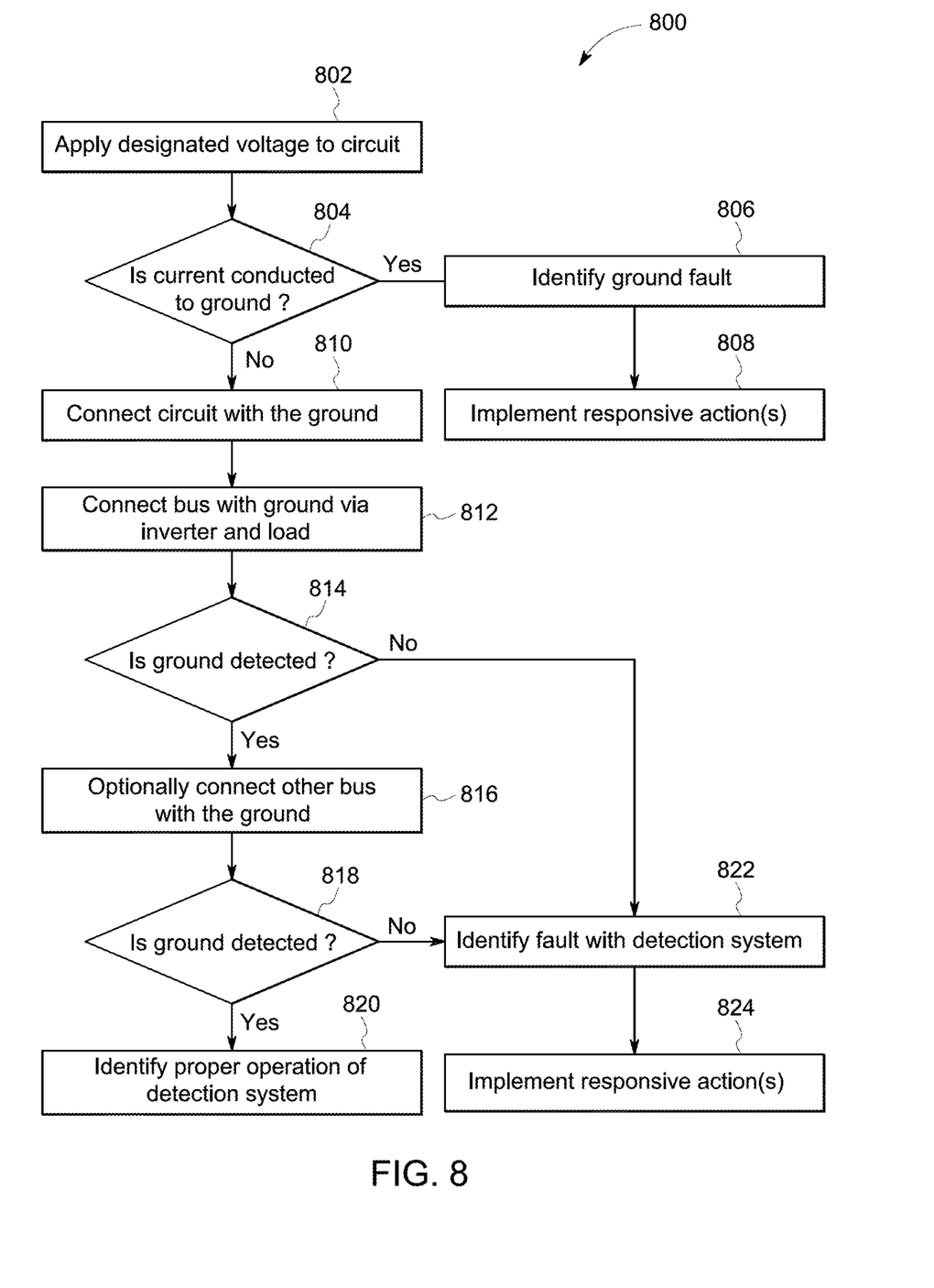
FIG. 8 illustrates a flowchart of one embodiment of a method for testing a ground fault detection system in an electric circuit.

FIG. 8 illustrates a flowchart of one embodiment of a method 800 for testing a ground fault detection system in an electric circuit. The method 800 may be used to check the operation of the ground fault detection system 102 and/or 702. In one embodiment, the method 800 can be performed by the controller 726, and may represent software that controls operation of the controller 726, or may be used to create such software.

The method 800 provides a check on pre-existing circuit current leakage before trip test, thereby ensuring safe testing and preventing contingent component damage. For example, performance of the method 800 checks for pre-existing ground faults before powering the loads of the circuit of the powered system, thereby avoiding damage to components of the circuit in the event that a pre-existing ground fault is present.

At 802, a designated voltage is applied to the circuit of a powered system. For example, the controller 726 may direct the power source 706 to apply a voltage (e.g., 1,000 volts or another amount) to the positive DC bus 714 of the circuit 700 of the powered system.

At 804, a determination is made as to whether current is conducted to the chassis ground of the circuit of the powered system. For example, the detection system 702 may examine current conducted in the circuit 700 to determine whether current is conducted from the designated voltage applied to the DC bus 714, 716. The detection system 702 includes voltage divider circuit formed from resistors R1, R2, R3, and R4 and measures current conducted through resistive elements or resistors R3, R4 that are connected in series with each other and with the chassis ground 730 (with the detection system 702 disposed between the resistors R3, R4). If current is detected as being conducted through the resistors R3, R4, then this current may indicate that there is a ground fault in the circuit 700 of the powered system. As a result, flow of the method 800 can proceed toward 806. But, if no current is detected, then this absence of current may indicate that there is no pre-existing ground fault in the circuit 700 of the powered system. As a result, flow of the method 800 can proceed toward 810.

At 806, a ground fault in the circuit of the powered system is identified. The conduction of current through the resistors R3 and/or R4 indicates that one or more components of the powered system are conductively connected with the chassis ground 730 prior to powering the load 718. In order to prevent damage to one or more components of the powered system and/or a safety risk to an operator of the powered system, flow of the method 800 may proceed toward 808 to implement one or more responsive actions.

At 808, one or more responsive actions are implemented in response to detecting the pre-existing ground fault. For example, a controller of the powered system may prevent the power supply 706 from supplying current to the load 718 due to the ground fault. This may include opening one or more switches, disabling or otherwise turning off the power supply 706, etc. As another example, the controller of the powered system may communicate a signal to one or more off-board locations to request and/or schedule inspection, repair, and/or maintenance of the powered system to determine and potentially fix the cause of the ground fault. In one embodiment, the responsive action can include isolating the fault location, such as by opening one or more switches or relays to disconnect the source of the ground fault from the circuit 700 of the powered system. Optionally, the controller 726 of the testing system may implement the one or more responsive actions.

At 810, with no pre-existing ground fault being detected, the circuit of the powered system is coupled with the ground in a location between one or more inverters and one or more loads powered by the inverters. With respect to the circuit 700 of the powered system shown in FIG. 7, the testing system 701 can close the grounding switch S1 to conductively couple the circuit 700 with the ground 730. The grounding switch S1 can be closed by communicating a control signal (e.g., from the controller 726) to the switch S1, thereby avoiding manual intervention or manipulation of the switch S1 or circuit 730 of the powered system. The switch S1 may be in an open state during the check for pre-existing ground faults (e.g., at 802 and 804) to prevent the load 718 from being connected with the ground 730 via the switch S1.

In the embodiment illustrated in FIG. 7, the grounding switch S1 is conductively coupled with a conductive winding 732 of the load 718 that is conductively coupled with the leg 709 of the inverter 708. This results in the leg 709 of the inverter 708 being connected with the ground 730 responsive to closing the grounding switch S1. Alternatively, the grounding switch S1 may be conductively coupled with another conductive winding of the load 718 that is conductively coupled with another leg 711 or 713 of the inverter 708.

At 812, a bus in the circuit of the powered system is connected with the ground via the inverter and the load. For example, the switch A1 in the inverter 708 may be closed (while the switch A2 in the same leg 709 of the inverter 708 remains open) to conductively couple the positive DC bus 714 with the ground 730 via the closed switch A1, the load 718, and the closed grounding switch S1. The power supply 706 may generate or continue to generate current that is conducted along the bus 714 such that the current is conducted to the ground 730 to simulate, emulate, or otherwise operate in a manner similar or identical to a ground fault of the circuit 700.

The current that is conducted through the bus 714, through the closed switch A1 of the inverter 708, through the load 718, through the closed grounding switch S1, and to the ground 730 may be conducted without activating the load 718. For example, if the load 718 is a motor, this current may be conducted through the motor without causing the motor to generate torque or otherwise operate.

At 814, a determination is made as to whether current is detected as being conducted from the power supply, through the inverter with the closed switch, through the load, and to the ground. For example, a determination may be made as to whether the bus 714 is conductively coupled with the ground 730. If the detection system 702 detects that the circuit 700 of the powered system is connected with the ground 730 (as described above), then the detection system 702 may be operating correctly. As a result, flow of the method 800 may proceed toward 816. Optionally, the method 800 may terminate. But, if the current is not detected as being conducted to the ground, then this absence of a ground current may be indicative of a problem with the detection system. As a result, flow of the method 800 can proceed toward 818.

At 816, another bus in the circuit of the powered system optionally is connected with the ground via the inverter and the load. For example, the switch A2 in the inverter 708 may be closed (while the switch A1 in the same leg 709 of the inverter 708 remains open or is opened) to conductively couple the negative DC bus 716 with the ground 730 via the closed switch A2, the load 718, and the closed grounding switch S1. The power supply 706 may generate or continue to generate current that is conducted along the bus 716 such that the current is conducted to the ground 730 to simulate, emulate, or otherwise operate in a manner similar or identical to a ground fault of the circuit 700.

The current that is conducted through the bus 716, through the closed switch A2 of the inverter 708, through the load 718, through the closed grounding switch S1, and to the ground 730 may be conducted without activating the load 718. For example, if the load 718 is a motor, this current may be conducted through the motor without causing the motor to generate torque or otherwise operate.

While the method 800 describes closing switches A1 or A2 in the leg 709 of the inverter 708 to create a ground fault and check the operation of the detection system 702, alternatively, the method 800 may close the switches B1 or B2 in the leg 710 or the switches C1 or C2 in the leg 711 of the inverter 708 to create the ground fault and check the operation of the detection system 702.

At 818, a determination is made as to whether current is detected as being conducted from the power supply, through the inverter with the closed switch, through the load, and to the ground. For example, a determination may be made as to whether the bus 716 is conductively coupled with the ground 730. If the detection system 702 detects that the circuit 700 of the powered system is connected with the ground 730 (as described above), then the detection system 702 may be operating correctly. As a result, flow of the method 800 may proceed toward 820. Optionally, the method 800 may terminate. But, if the current is not detected as being conducted to the ground, then this absence of a ground current may be indicative of a problem with the detection system. As a result, flow of the method 800 can proceed toward 822.

At 820, the proper functionality or operation of the detection system is identified and reported to an operator of the powered system. For example, the controller 726 may generate a notification signal that causes an output device of the powered system (e.g., a speaker, display, light, alarm, or the like) to notify the operator that ground fault had been successfully identified and the detection system 702 is operating correctly to identify ground faults. In one embodiment, the controller 726 may communicate with a controller of the powered system to prevent activation or operation of the powered system unless and until the controller 726 determines that the detection system 702 is operating correctly.

At 822, an error in the ground fault detection system is identified. For example, responsive to the detection system 702 not detecting a ground fault subsequent to a switch in an inverter being closed to conductively couple the positive and/or negative DC bus 714, 716 with the ground 730 through the load 718, the method 800 may determine that the detection system 702 is not operating properly. This may indicate that the detection system 702 has some fault, error, or damage that is preventing the detection system 702 from accurately identifying ground faults. The detection system 702 may be miswired, damaged, etc.

At 824, one or more responsive actions are implemented in response for not detecting the ground fault. For example, a controller of the powered system may prevent the power supply 706 from supplying current to the load 718 due to the ground fault. This may include opening one or more switches, disabling or otherwise turning off the power supply 706, etc. As another example, the controller of the powered system may communicate a signal to one or more off-board locations to request and/or inspection, repair, checking ground circuit integrity and/or maintenance of the powered system.

The method 800 prevents harm to an operator that otherwise would manually check for ground faults. For example, if a pre-existing ground fault exists in the circuit of the powered system, during a manual test for the ground fault, there could be a short circuit resulting in very high level of fault current. This fault current can extensively damage the jumper wires used to manually check for ground faults and components of the powered system. This could result in personal injury, smoke in the control cabinet, and expensive component damage. The detection method 800 provided herein checks for pre-existing ground faults, closes switches or relays of the inverters, etc., to safely perform checks for ground faults without any manual intervention.

In one embodiment, the method 800 may be performed autonomously so that an operator can avoid manipulating or interacting with the circuit of the powered system. For example, the operator can direct the method 800 to be performed by simply actuating an input device (described below) of a powered system, such as a touchscreen, button, lever, etc. This can avoid the operator having to intervene or manipulate the circuit of the propulsion system, such as by using cables to ground the circuit.

Figure 9:
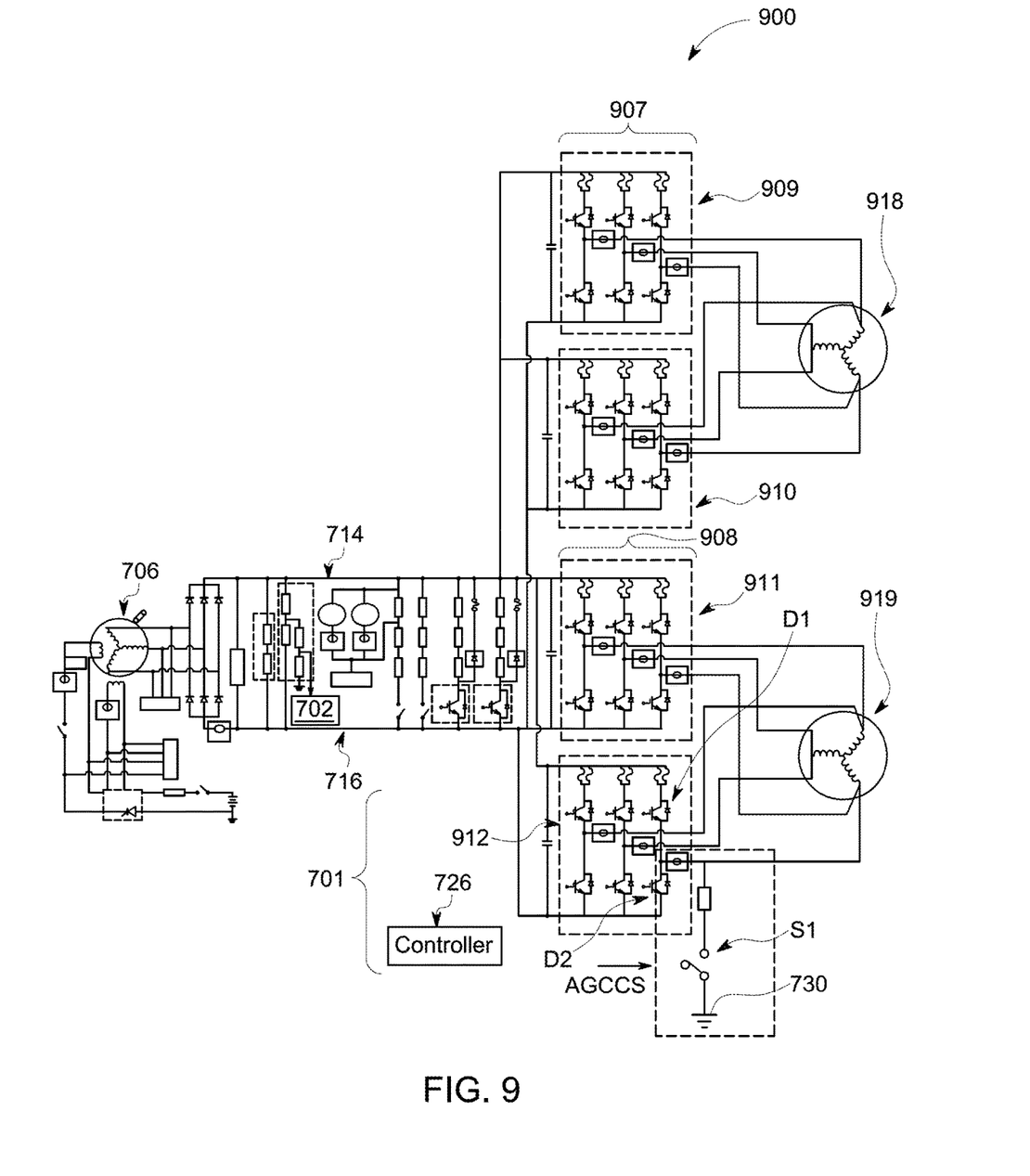
FIG. 9 illustrates the testing system shown in FIG. 1 according to an embodiment that operates with a circuit of a powered system that includes a dual inverter.

FIG. 9 illustrates the testing system 701 shown in FIG. 1 according to an embodiment that operates with a circuit 900 of a powered system that includes a dual inverter 908. The testing system 701 is operatively coupled with the circuit 900 to examine operation of the ground fault detection system 702 to ensure that the detection system 702 is functioning properly and is able to detect one or more ground faults in the circuitry 900 of the powered system. The testing system 701 may examine operation of the detection system 702 by changing a state of the circuitry 900 of the powered system to create a ground or ground fault and determining whether the detection system 702 identified the ground or ground fault, similar to as described above.

One difference between the circuit 700 shown in FIG. 7 and the circuit 900 shown in FIG. 9 is the inclusion of the dual inverters 907, 908. The dual inverters include two inverters in parallel inverters 909, 910 (e.g., for dual inverter 907) and 911, 912 (e.g., for dual inverter 908) that are conductively coupled with the buses 714, 716 and different (e.g., separately controllable) loads 718 (e.g., loads 918, 919). The dual inverters 907, 908 receive DC from the power source 706 and convert the DC into AC that is provided to the loads 918, 919 by the inverters 909, 910, 911, 912 for powering the loads 918, 919.

In the illustrated example, the inverter 708 supplies different phases of a three-phase AC to the load 718. For example, the inverter 708 may supply a first phase (e.g., phase A) of AC to the load 718 via a first leg 709 of the inverter 708 having two switches A1, A2, a second phase (e.g., phase B) of AC that is temporally shifted or delayed relative to the first phase (e.g., by one hundred and twenty degrees) via a second leg 711 of the inverter 708 having two switches B1, B2, and a third phase (e.g., phase C) of AC that is temporally shifted or delayed relative to the second phase (e.g., by one hundred and twenty degrees) via a third leg 713 of the inverter 708 having two switches C1, C2.

The testing system 701 includes the grounding switch S1 that is conductively coupled with the ground 730, with the switch S1 disposed between the load 919 and the ground 730. The switch S1 is controlled by the controller 726 to alternate between an open state (where the switch S1 disconnects the load 919 from the ground 730) and a closed state (where the switch S1 connects the load 919 with the ground 730).

In operation, the controller 726 tests the operation of the detection system 702 by directing the grounding switch S1 to close and by directing a positive bus inverter switch D1 (that is connected with the positive DC bus 714 and the load 919) to close (while a negative bus inverter switch D2 (which is connected with the negative DC bus 716 and the load 919) to remain open. This connects the positive DC bus 714 with the ground 730 via the closed inverter switch D1 and the closed grounding switch S1. If the detection system 702 detects the ground fault caused by this state of the circuit 900, then the testing system 701 can determine that the detection system 702 is operating correctly (at least with respect to detecting the grounding of the positive DC bus 714). The controller 726 also can test the operation of the detection system 702 by directing the grounding switch S1 to close and by directing the negative bus inverter switch D2 to close (while the positive bus inverter switch D1 remains open or is opened. This connects the negative DC bus 716 with the ground 730 via the closed inverter switch D2 and the closed grounding switch S1. If the detection system 702 detects the ground fault caused by this state of the circuit 900, then the testing system 701 can determine that the detection system 702 is operating correctly (at least with respect to detecting the grounding of the negative DC bus 716).

Figure 10:
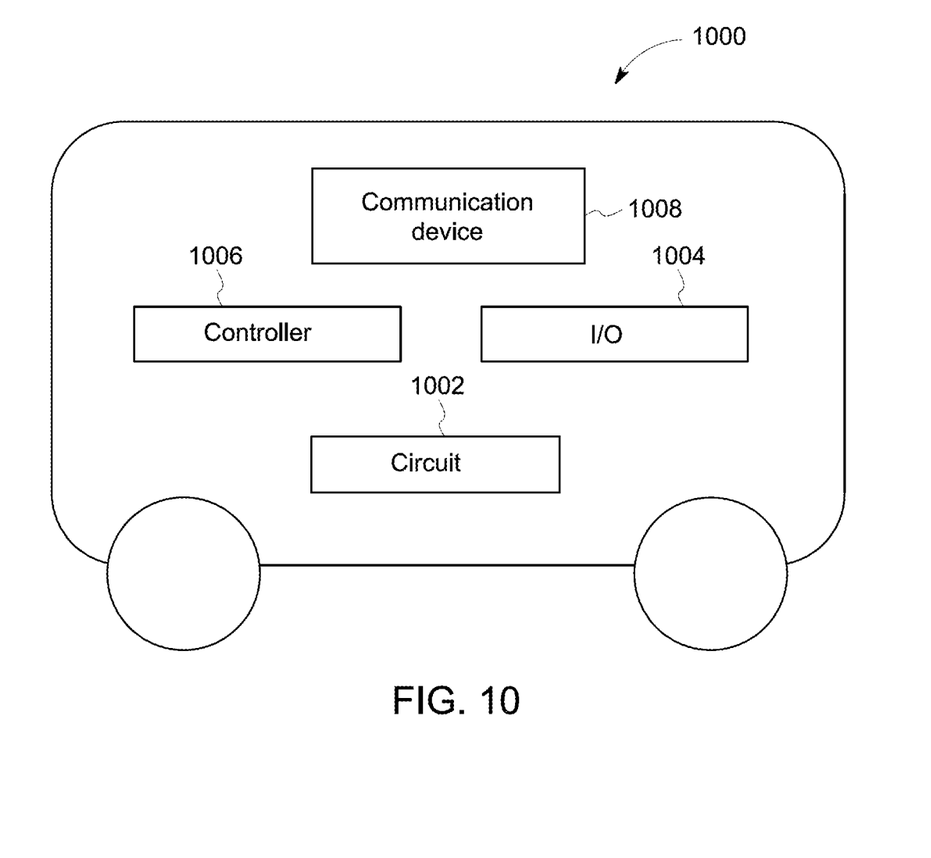
FIG. 10 illustrates a powered system with the ground fault detection system and/or the testing system according to one embodiment.

FIG. 10 illustrates a powered system 1000 with the ground fault detection system 702 and/or the testing system 701 (both shown in FIGS. 7 and 9) according to one embodiment. The powered system 1000 can represent a propulsion-generating vehicle, such as a locomotive, an automobile, a mining vehicle, an off-highway vehicle (e.g., a vehicle that is not permitted or is not designed for travel on public roadways), a marine vessel, etc. The system 1000 includes a propulsion circuit 1002, which can represent a portion of or all of the circuits 700, 900 shown in FIGS. 7 and 9.

The system 1000 can include one or more input and/or output devices 1004 ("I/O" in FIG. 10) that receive input from an operator and/or provide output signals to the operator or other devices. The devices 1004 can include one or more touchscreens, keyboards, electronic mice, styluses, microphones, display devices (other than touchscreens), speakers, lights, etc.

The system 1000 includes one or more components of a controller 1006, such as a vehicle controller. The controller 1006 represents hardware circuitry that includes and/or is connected with one or more processors (e.g., microprocessors, field programmable gate arrays, or integrated circuits). The controller 1006 may control operation of the system 1000, such as by generating control signals to the circuit 1002 to control the torque generated by the loads 718, 918, 919 (shown in FIGS. 7 and 9), the current provided by the power supply 706, etc. Optionally, the controller 1006 may control the opening or closing of the switches or relays A1, A2, B1, B2, C1, C2, D1, D2 in the inverters 708, 909, 911 (shown in FIGS. 7 and 9) and/or the grounding switch or relay S1 to perform the method 800 described above. The controller 1006 may communicate with the detection system 702 to determine if ground faults exist in the circuit 1002, and to implement the responsive actions described herein. The controller 1006 can generate the signals described herein to warn an operator of the system 1000 of ground faults via the device 1004, to notify off-board locations of detected ground faults via a communication device 1008, etc. The communication device 1008 can represent hardware circuitry, such as transceiving circuitry that includes and/or is connected with one or more modems, antennas, routers, or the like, for communicating signals with other devices or systems (onboard or off-board the vehicle) via one or more wired and/or wireless connections.

In one embodiment, a method (e.g., for identifying ground faults in one or more inverters of a circuit of a powered system) includes determining three phase voltages provided from each of plural inverters in a powered system to one or more loads of the powered system while each of the inverters is powered by a power supply, determining symmetrical components of the three phase voltages for each of the inverters, and identifying a ground fault in one or more of the inverters while each of the inverters is powered by the power supply based on the symmetrical components of the three phase voltages.

Determining the three phase voltages provided from the inverters can include measuring the three phase voltages of the inverters connected to and powered by current conducted from the power supply to the inverters via a common conductive bus.

The powered system may be a vehicle, and determining the three phase voltages provided from the inverters to the one or more loads can occur while the inverters provide the three phase voltages to one or more motors as the one or more loads to propel the vehicle.

The ground fault can be identified based on zero sequence components of the symmetrical components of the three phase voltages. Optionally, the ground fault is identified by comparing magnitudes of the zero sequence components of the symmetrical components and identifying the ground fault as associated with the three phase voltage having a zero sequence component that is larger than one or more other inverters of the powered system.

Identifying the ground fault can include determining which of the inverters is associated with the ground fault based on frequencies of the symmetrical components.

Additionally or alternatively, the method also may include stopping conduction of current from the power supply to one or more of the inverters associated with the ground fault responsive to identifying the ground fault.

In one embodiment, a method (e.g., for testing a ground fault detection system in an electric circuit) includes establishing a first ground connection between a bus (in a powered circuit comprising an inverter coupled with a power supply via the bus and that supplies current to a load of the powered circuit) and a ground via the inverter and the load by closing an inverter switch of the inverter and a grounding switch disposed between the load and the ground, determining whether the first ground connection is detected by a ground fault detection system conductively coupled with the inverter, the power supply, the load, and the ground, and determining a fault in the ground fault detection system responsive to the first ground connection not being detected by the ground fault detection system.

The method optionally may include, prior to establishing the first ground connection, supplying the current from the power supply to the inverter along the bus, and determining whether the ground fault detection system located between the bus and the ground detects a ground fault in the powered circuit based on detection of the current being conducted from the bus to the ground.

The first ground connection can be established without manual intervention of the powered circuit.

The bus can be a positive direct current (DC) bus connected with the power supply and the inverter switch can be a positive inverter switch coupled with the positive DC bus. Establishing the first ground connection can include closing the positive inverter switch in the inverter that conductively couples the positive DC bus with the ground via the load.

The method also can include opening the positive inverter switch, closing a negative inverter switch coupled with a negative DC bus that also is connected with the power supply, establishing a second ground connection by closing the grounding switch or keeping the grounding switch closed to conductively couple the negative DC bus with the ground, determining whether the second ground connection is detected by the ground fault detection circuit, and determining the fault in the ground fault detection circuit responsive to the second ground connection not being detected by the ground fault detection circuit.

In one embodiment, a system includes an inverter conductively coupled with a load by inverter switches in the inverter. The inverter is configured to convert a direct current to an alternating current supplied to the load. The system also includes a bus conductively coupled with a power supply and the inverter. The bus is configured to conduct the direct current from the power supply to the inverter. The system includes a grounding switch conductively coupled with the load and a ground between the load and the ground. The grounding switch is configured to close to couple the load with the ground and a first inverter switch in the inverter is configured to close to establish a first ground connection between the bus and the ground via the load. The system includes a ground fault detection system conductively coupled with the bus and the ground. The ground fault detection system is configured to detect conduction of current to the ground as a ground fault. The system includes one or more processors configured to determine a fault in the ground fault detection circuit responsive to the first ground connection not being detected by the ground fault detection system.

In one example, the one or more processors are configured to, prior to establishing the first ground connection, direct the power supply to conduct the current from the power supply along the bus, and the one or more processors are configured to determine whether the ground fault detection circuit detects the current conducted from the bus to the ground.

The first ground connection can be established without manual intervention of a circuit that includes the inverter, the load, and the grounding switch.

The one or more processors can be configured to interrupt the first ground connection, establish a different, second ground connection between the bus and the ground via the load by closing a different, second inverter switch of the inverter, determine whether the second ground connection is detected by the ground fault detection circuit, and determine the fault in the ground fault detection circuit responsive to the second ground connection not being detected.

The bus can be a positive direct current (DC) bus and the first inverter switch is conductively coupled with the positive DC bus and the load.

The power supply also can be conductively coupled with a negative DC bus and the inverter can include a second inverter switch conductively coupled with the negative DC bus and the load. The one or more processors can be configured to close the second inverter switch and to close the grounding switch to determine whether the ground fault detection system detects a ground fault between the negative DC bus and the ground.

The inverter can be one of plural inverters coupled with the bus, and the ground fault detection system can be configured to detect the ground fault by determining three phase voltages provided from each of the plural inverters to the load while each of the inverters is powered by the power supply, determining symmetrical components of the three phase voltages for each of the inverters, and identifying the ground fault in one or more of the inverters while each of the inverters is powered by the power supply based on the symmetrical components of the three phase voltages.

The ground fault detection system can be configured to detect the ground fault based on zero sequence components of the symmetrical components of the three phase voltages.

The foregoing description of certain embodiments of the inventive subject matter will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (for example, processors or memories) may be implemented in a single piece of hardware (for example, a general purpose signal processor, microcontroller, random access memory, hard disk, and the like). Similarly, the programs may be stand-alone programs, may be incorporated as subroutines in an operating system, may be functions in an installed software package, and the like. The various embodiments are not limited to the arrangements and instrumentality shown in the drawings.

The above description is illustrative and not restrictive. For example, the above-described embodiments (and/or aspects thereof) may be used in combination with each other. In addition, many modifications may be made to adapt a particular situation or material to the teachings of the inventive subject matter without departing from its scope. While the dimensions and types of materials described herein are intended to define the parameters of the inventive subject matter, they are by no means limiting and are exemplary embodiments. Other embodiments may be apparent to one of ordinary skill in the art upon reviewing the above description. The scope of the inventive subject matter should, therefore, be determined with reference to the appended claims, along with the full scope of equivalents to which such claims are entitled.

In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure. And, as used herein, an element or step recited in the singular and proceeded with the word "a" or "an" should be understood as not excluding plural of said elements or steps, unless such exclusion is explicitly stated. Furthermore, references to "one embodiment" of the inventive subject matter are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

This written description uses examples to disclose several embodiments of the inventive subject matter and also to enable a person of ordinary skill in the art to practice the embodiments of the inventive subject matter, including making and using any devices or systems and performing any incorporated methods. The patentable scope of the inventive subject matter is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

What is claimed is:

1. A method comprising:
   determining three phase voltages provided from each of plural inverters in a vehicle to one or more traction motors of the vehicle while each of the inverters is powered by a power supply;
   determining symmetrical components of the three phase voltages for each of the inverters; and
   identifying a ground fault in one or more of the inverters while each of the inverters is powered by the power supply based on the symmetrical components of the three phase voltages.

2. The method of claim 1, wherein determining the three phase voltages provided from the inverters includes measuring the three phase voltages of the inverters connected to and powered by current conducted from the power supply to the inverters via a common conductive bus.

3. The method of claim 1, wherein the is a locomotive, and determining the three phase voltages provided from the inverters to the one or more traction motors occurs while the one or more traction motors propel the locomotive.

4. The method of claim 1, wherein the ground fault is identified based on zero sequence components of the symmetrical components of the three phase voltages.

5. The method of claim 4, wherein the ground fault is identified by comparing magnitudes of the zero sequence components of the symmetrical components and identifying the ground fault as associated with the three phase voltage having a zero sequence component that is larger than one or more other inverters of the vehicle.

6. The method of claim 1, wherein identifying the ground fault includes determining which of the inverters is associated with the ground fault based on frequencies of the symmetrical components.

7. The method of claim 1, further comprising stopping conduction of current from the power supply to one or more of the inverters associated with the ground fault responsive to identifying the ground fault.

8. A method comprising:
   in a vehicle having a powered circuit comprising an inverter coupled with a power supply via a bus and that supplies current to a traction motor of the vehicle, establishing a first ground connection between the bus and a ground via the inverter and the traction motor by closing an inverter switch of the inverter and a grounding switch disposed between the load and the ground;
   determining whether the first ground connection is detected by a ground fault detection system conductively coupled with the inverter, the power supply, the traction motor, and the ground; and
   determining a fault in the ground fault detection system responsive to the first ground connection not being detected by the ground fault detection system.

9. The method of claim 8, further comprising:
   prior to establishing the first ground connection, supplying the current from the power supply to the inverter along the bus; and
   determining whether the ground fault detection system located between the bus and the ground detects a ground fault in the powered circuit based on detection of the current being conducted from the bus to the ground.

10. The method of claim 8, wherein the first ground connection is established without manual intervention of the powered circuit.

11. The method of claim 8, wherein the bus is a positive direct current (DC) bus connected with the power supply and the inverter switch is a positive inverter switch coupled with the positive DC bus, and wherein establishing the first ground connection includes closing the positive inverter switch in the inverter that conductively couples the positive DC bus with the ground via the traction motor.

12. The method of claim 11, further comprising:
    opening the positive inverter switch;
    closing a negative inverter switch coupled with a negative DC bus that also is connected with the power supply;
    establishing a second ground connection by closing the grounding switch or keeping the grounding switch closed to conductively couple the negative DC bus with the ground;
    determining whether the second ground connection is detected by the ground fault detection system; and
    determining the fault in the ground fault detection system responsive to the second ground connection not being detected by the ground fault detection system.

13. A system comprising:
    an inverter conductively coupled with a traction motor of a vehicle by inverter switches in the inverter, the inverter configured to convert a direct current to an alternating current supplied to the traction motor;
    a bus conductively coupled with a power supply and the inverter, the bus configured to conduct the direct current from the power supply to the inverter;
    a grounding switch conductively coupled with the traction motor and a ground between the traction motor and the ground, wherein the grounding switch is configured to close to couple the traction motor with the ground and a first inverter switch in the inverter is configured to close to establish a first ground connection between the bus and the ground via the traction motor;
    a ground fault detection system conductively coupled with the bus and the ground, the ground fault detection system configured to detect conduction of current to the ground as a ground fault; and
    one or more processors configured to determine a fault in the ground fault detection system responsive to the first ground connection not being detected by the ground fault detection system.

14. The system of claim 13, wherein the one or more processors are configured to, prior to establishing the first ground connection, direct the power supply to conduct the current from the power supply along the bus, and the one or more processors are configured to determine whether the ground fault detection system detects the current conducted from the bus to the ground.

15. The system of claim 13, wherein the first ground connection is established without manual intervention of a circuit that includes the inverter, the traction motor, and the grounding switch.

16. The system of claim 13, wherein the one or more processors are configured to interrupt the first ground connection, establish a different, second ground connection between the bus and the ground via the load by closing a different, second inverter switch of the inverter, determine whether the second ground connection is detected by the ground fault detection system, and determine the fault in the ground fault detection system responsive to the second ground connection not being detected.

17. The system of claim 13, wherein the bus is a positive direct current (DC) bus and the first inverter switch is conductively coupled with the positive DC bus and the traction motor.

18. The system of claim 17, wherein the power supply also is conductively coupled with a negative DC bus and the inverter includes a second inverter switch conductively coupled with the negative DC bus and the load, and wherein the one or more processors are configured to close the second inverter switch and to close the grounding switch to determine whether the ground fault detection system detects a ground fault between the negative DC bus and the ground.

19. The system of claim 13, wherein the inverter is one of plural inverters coupled with the bus, and wherein the ground fault detection system is configured to detect the ground fault by determining three phase voltages provided from each of the plural inverters to the traction motor while each of the inverters is powered by the power supply, determining symmetrical components of the three phase voltages for each of the inverters, and identifying the ground fault in one or more of the inverters while each of the inverters is powered by the power supply based on the symmetrical components of the three phase voltages.

20. The system of claim 19, wherein the ground fault detection system is configured to detect the ground fault based on zero sequence components of the symmetrical components of the three phase voltages.

* * * * *